US 6,456,489 B1

(12) United States Patent
Davis et al.

(10) Patent No.: US 6,456,489 B1
(45) Date of Patent: Sep. 24, 2002

(54) DEVICE RETENTION APPARATUS

(75) Inventors: David R. Davis, Jefferson, SD (US);
Vernon Erickson; Paul Amdahl, both of Sioux City, IA (US); Daniel Castillo, El Paso, TX (US); David Williams, El Paso, TX (US); Paul Hooper, El Paso, TX (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 09/583,112

(22) Filed: May 25, 2000

(51) Int. Cl.$^7$ .............................. G06F 1/16; H05K 7/10; A47B 95/02
(52) U.S. Cl. ........................ 361/684; 361/685; 361/726; 312/332.1; 312/333; 439/483; 439/157
(58) Field of Search ................................ 361/683, 685, 361/686, 684, 724–727; 312/332.1, 333, 223.2; 439/152, 155, 157, 159, 483, 484

(56) References Cited

U.S. PATENT DOCUMENTS

| | | | |
|---|---|---|---|
| 4,532,564 A | 7/1985 | Larson et al. ................. 360/97 |
| 4,694,380 A | 9/1987 | Mallory et al. .............. 361/424 |
| 4,896,777 A | 1/1990 | Lewis .......................... 211/41 |
| 4,914,550 A | 4/1990 | Filsinger et al. ............ 361/386 |
| 4,960,384 A | 10/1990 | Singer et al. ................ 439/155 |
| 4,977,532 A | 12/1990 | Barkowicz et al. .......... 364/708 |
| 4,980,800 A | 12/1990 | Furuta ......................... 361/391 |
| 5,003,431 A | 3/1991 | Imsdahl ....................... 361/415 |
| 5,031,070 A | 7/1991 | Hsu ............................. 361/380 |
| 5,067,041 A | 11/1991 | Cooke et al. ................ 361/394 |
| 5,098,175 A | 3/1992 | Cooke et al. ............. 312/341.1 |
| 5,100,215 A | 3/1992 | Cooke et al. ............. 312/257.1 |
| 5,112,119 A | 5/1992 | Cooke et al. ............... 312/283 |
| 5,121,296 A | 6/1992 | Hsu ............................. 361/395 |
| 5,142,447 A | 8/1992 | Cooke et al. ................ 361/394 |
| 5,164,886 A | 11/1992 | Chang ......................... 361/390 |
| 5,175,670 A | 12/1992 | Wang .......................... 361/390 |
| 5,216,582 A | 6/1993 | Russell et al. ............... 361/395 |
| 5,222,897 A | 6/1993 | Collins et al. ............... 439/157 |
| D338,664 S | 8/1993 | Goff ............................ D14/114 |
| 5,253,129 A | 10/1993 | Blackborow et al. .......... 360/69 |
| 5,277,615 A | 1/1994 | Hastings et al. |
| 5,297,009 A | 3/1994 | Gelez et al. ................. 361/796 |
| 5,299,095 A | 3/1994 | Feuerlein et al. ........... 361/801 |
| 5,299,944 A | 4/1994 | Larabell et al. ............. 439/157 |
| 5,305,180 A | 4/1994 | Mitchell et al. |
| 5,321,962 A | 6/1994 | Ferchau et al. ............... 70/208 |
| 5,325,263 A | 6/1994 | Singer et al. ................ 361/683 |
| 5,332,306 A | 7/1994 | Babb et al. ............. 312/334.16 |
| 5,333,097 A | 7/1994 | Christensen et al. ........ 361/685 |
| 5,340,340 A | 8/1994 | Hastings et al. ............... 439/64 |
| 5,379,184 A * | 1/1995 | Barraza et al. .............. 361/685 |
| 5,392,192 A | 2/1995 | Dunn et al. .................. 361/683 |
| 5,460,441 A | 10/1995 | Hastings et al. ............. 312/298 |
| 5,481,431 A | 1/1996 | Siahpolo et al. ............ 361/685 |
| 5,495,389 A | 2/1996 | Dewitt et al. ............... 361/683 |
| 5,496,181 A | 3/1996 | Addison et al. .............. 439/61 |

(List continued on next page.)

*Primary Examiner*—Darren Schuberg
*Assistant Examiner*—Lisa Lea-Edmonds
(74) *Attorney, Agent, or Firm*—William J. Breen, III; Scott C. Richardson; Suiter & Associates

(57) ABSTRACT

The present invention is directed to a device retention apparatus. A device retention apparatus includes a housing suitable for mounting an information handling system device and a retaining portion disposed on the housing, the retaining portion suitable for engaging an information handling system device when disposed in the housing. A selection mechanism suitable for securing the information handling system device to the housing is slideably connected to the housing so as to be capable of moving between a first position and a second position. Therefore, as the selection mechanism is moved from the first position to the second position, the selection mechanism contacts the retaining portion thereby securing an information handling system device to the housing.

29 Claims, 11 Drawing Sheets

U.S. PATENT DOCUMENTS

| | | | | |
|---|---|---|---|---|
| 5,502,604 A | | 3/1996 | Furay | 360/97.01 |
| 5,510,955 A | | 4/1996 | Taesang | 361/685 |
| 5,518,412 A | | 5/1996 | Larabell | 439/157 |
| 5,524,104 A | | 6/1996 | Iwata et al. | 369/77.2 |
| 5,535,093 A | * | 7/1996 | Noguchi et al. | 361/686 |
| 5,557,499 A | | 9/1996 | Reiter et al. | 361/685 |
| 5,564,585 A | | 10/1996 | Saitoh | 220/241 |
| 5,566,383 A | | 10/1996 | Gildea et al. | 361/685 |
| 5,571,256 A | | 11/1996 | Good et al. | 211/26 |
| 5,584,396 A | | 12/1996 | Schmitt | 211/26 |
| 5,586,003 A | | 12/1996 | Schmitt et al. | 361/683 |
| 5,587,856 A | | 12/1996 | Aoyama | 360/99.02 |
| 5,588,728 A | | 12/1996 | Eldridge et al. | 312/332.1 |
| 5,599,080 A | | 2/1997 | Ho | 312/334.7 |
| 5,602,696 A | | 2/1997 | Hanson | 360/97.01 |
| 5,652,695 A | | 7/1997 | Schmitt | 361/685 |
| 5,652,697 A | | 7/1997 | Le | 361/788 |
| 5,673,171 A | | 9/1997 | Varghese et al. | 361/685 |
| 5,673,172 A | | 9/1997 | Hastings et al. | 361/685 |
| 5,680,293 A | | 10/1997 | McAnally et al. | 361/685 |
| 5,680,295 A | | 10/1997 | Le et al. | 361/695 |
| 5,682,291 A | | 10/1997 | Jeffries et al. | 361/1.85 |
| 5,683,159 A | | 11/1997 | Johnson | 312/334.7 |
| 5,687,059 A | | 11/1997 | Hoppal | 361/685 |
| 5,694,266 A | | 12/1997 | Bloom et al. | 360/97.01 |
| 5,708,563 A | | 1/1998 | Cranston, III et al. | 361/683 |
| 5,713,647 A | | 2/1998 | Kim et al. | 312/223.2 |
| 5,721,669 A | * | 2/1998 | Becker et al. | 361/685 |
| 5,724,227 A | | 3/1998 | Hancock et al. | 361/685 |
| 5,726,864 A | | 3/1998 | Copeland et al. | 361/800 |
| 5,726,922 A | | 3/1998 | Womble et al. | 364/708.1 |
| 5,730,515 A | | 3/1998 | Ho | 312/350 |
| 5,734,557 A | | 3/1998 | McAnally et al. | 361/727 |
| 5,737,185 A | | 4/1998 | Morrison et al. | 361/685 |
| 5,751,547 A | * | 5/1998 | Honda et al. | 361/686 |
| 5,779,496 A | | 7/1998 | Bolinger et al. | 439/377 |
| 5,781,408 A | | 7/1998 | Crane, Jr. et al. | 361/683 |
| 5,783,771 A | | 7/1998 | Copeland et al. | 174/35 R |
| 5,784,251 A | | 7/1998 | Miller et al. | 361/683 |
| 5,785,402 A | | 7/1998 | DeLorenzo | 312/350 |
| 5,790,373 A | | 8/1998 | Kim et al. | 361/685 |
| 5,801,920 A | | 9/1998 | Lee | 361/685 |
| 5,805,420 A | | 9/1998 | Burke | 361/727 |
| 5,808,864 A | | 9/1998 | Jung | 361/685 |
| 5,850,925 A | | 12/1998 | Gandre | 211/26 |
| 5,852,739 A | | 12/1998 | Radloff et al. | 395/800.01 |
| 5,865,518 A | | 2/1999 | Jarrett et al. | 312/223.2 |
| 5,867,369 A | | 2/1999 | Antonuccio et al. | 361/796 |
| 5,875,068 A | | 2/1999 | Sawada | 360/99.01 |
| 5,877,938 A | | 3/1999 | Hobbs et al. | 361/724 |
| 5,886,869 A | | 3/1999 | Fussell et al. | 361/685 |
| 5,896,273 A | | 4/1999 | Varghese et al. | 361/724 |
| 5,914,854 A | | 6/1999 | Holt | 361/683 |
| 5,914,855 A | | 6/1999 | Gustafson et al. | 361/685 |
| 5,924,780 A | | 7/1999 | Ammon et al. | 312/223.2 |
| 5,926,916 A | | 7/1999 | Lee et al. | 16/230 |
| 5,928,016 A | | 7/1999 | Anderson et al. | 439/159 |
| 5,948,087 A | | 9/1999 | Khan et al. | 710/102 |
| 5,963,431 A | | 10/1999 | Stancil | 361/803 |
| 5,973,934 A | | 10/1999 | Roscoe | 361/796 |
| 6,118,668 A | * | 9/2000 | Scholder et al. | 361/686 |
| 6,122,173 A | | 9/2000 | Felcman et al. | |

* cited by examiner

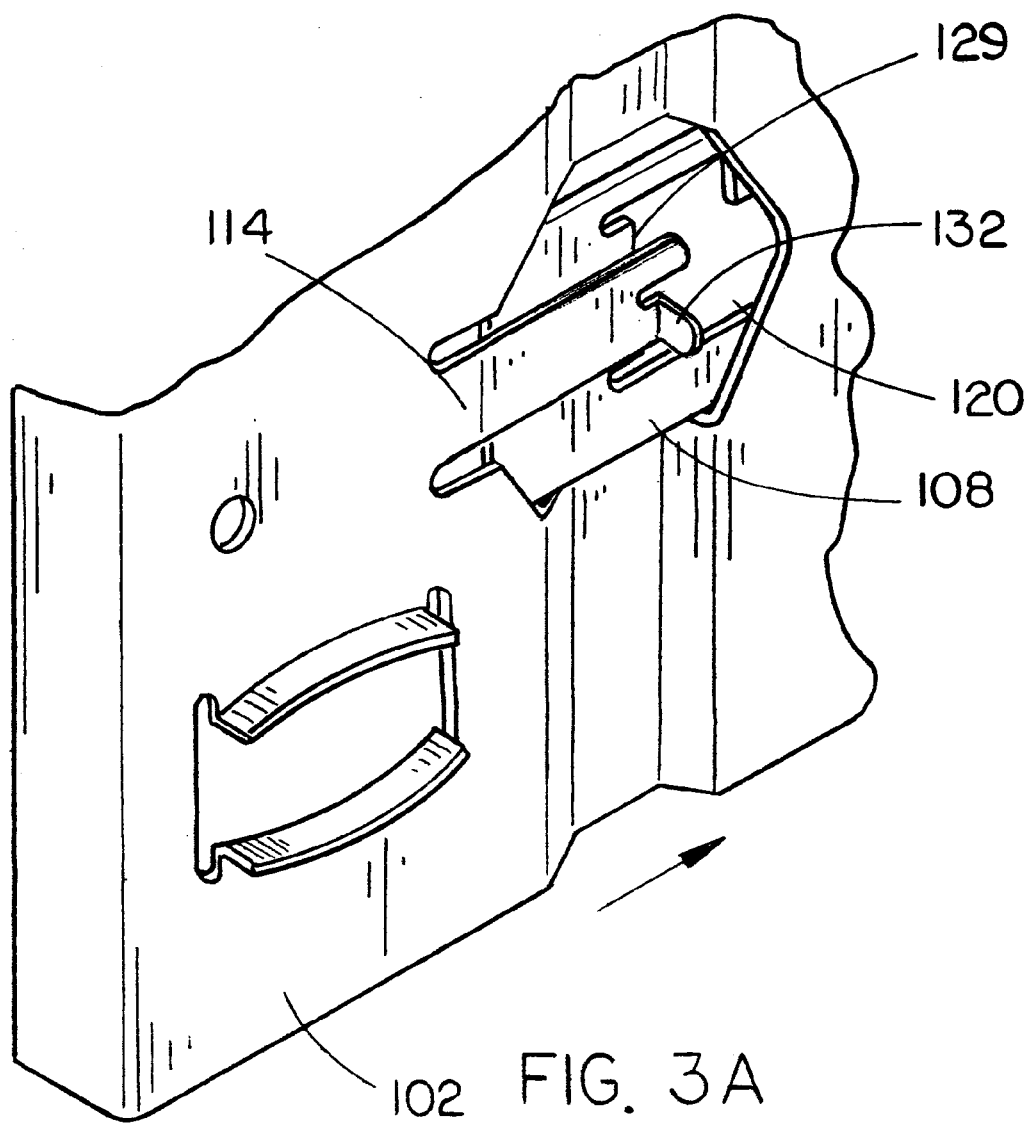

DEVICE RETENTION APPARATUS

FIELD OF THE INVENTION

The present invention generally relates to the field of mounting devices for information handling system devices, and particularly to a device retention apparatus.

BACKGROUND OF THE INVENTION

The manufacture and assembly of information handling systems has become increasingly more competitive. Manufacturers continually strive to improve the design and features of information handling systems yet still offer competitive prices. One such area of improvement is in the mounting of devices in an information handling system. An information handling system, such as a typical desktop system, tower, server, and the like, may include information handling system devices, such as disk drives, compact disk read-only memories (CD-ROMs), digital video disc (DVD) players, floppy drives, and the like. These devices are typically added to increase the functionality of the information handling system as may be desired by a user. However, the installation of these devices in the information handling system may be very labor intensive. For instance, the installation of a hard disk drive in an information handling system may involve the use of screws, typically four, to attach the drive to a housing included in the system. Typically, these screws are small making them difficult to manipulate and install. Additionally, because of their small size, the screws may be dropped by an assembler, possibly causing damage to the information handling system due to shorts, lodging in moving parts, and the like. Moreover, information handling systems have become increasingly smaller and smaller. With this smaller size comes a correspondingly lack of space, thus making it even more difficult to mount devices in an information handling system.

Further, the upgrade and repair of information handling system devices has become increasingly complicated. For example, a user may wish to add a larger hard drive, a digital video disk (DVD) player, and the like to an information handling system. However, the removal of an old device may require the user to remove a plurality of screws to release the old device and the installation of additional screws to install the new device. This may require a significant amount of time, as well as result in a loss of components, such as the screws and other attaching hardware.

Therefore, it would be desirable to provide an improved device retention apparatus.

SUMMARY OF THE INVENTION

Accordingly, the present invention is directed to a device retention apparatus. A device retention apparatus includes a housing suitable for mounting an information handling system device and a retaining portion disposed on the housing, the retaining portion suitable for engaging an information handling system device when disposed in the housing. A selection mechanism suitable for securing the information handling system device to the housing is slideably connected to the housing so as to be capable of moving between a first position and a second position. Therefore, as the selection mechanism is moved from the first position to the second position, the selection mechanism contacts the retaining portion thereby securing an information handling system device to the housing.

In a second aspect of the present invention, a device retention apparatus includes a housing suitable for mounting an information handling system device and a retaining portion disposed on the housing, the retaining portion suitable for engaging an information handling system device when disposed in the housing. A selection mechanism suitable for securing the information handling system device to the housing is slideably connected to the housing so as to be capable of contracting the retaining portion as the selection mechanism is slid along the housing. Thus, the retaining portion is capable of at least one of engaging an information handling system device to the housing and disengaging an information handling system device from the housing.

In a third aspect of the present invention, an information handling system chassis includes a chassis suitable for storage of information handling system devices and components and a housing suitable for mounting an information handling system device. A retaining portion is disposed on the housing, the retaining portion suitable for engaging an information handling system device when disposed in the housing. A selection mechanism suitable for securing the information handling system device to the housing is slideably connected to the housing so as to be capable of moving between a first position and a second position. Thus, as the selection mechanism is moved from the first position to the second position, the selection mechanism contacts the retaining portion thereby securing an information handling system device to the housing.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 3A is a magnified view of the exemplary embodiment as illustrated in FIG. 1 wherein a selection mechanism is utilized to move a retaining portion to a securing position;

DETAILED DESCRIPTION OF THE INVENTION

Reference will now be made in detail to the presently preferred embodiments of the invention, examples of which are illustrated in the accompanying drawings.

Referring generally now to FIGS. 1 through 7, exemplary embodiments of the present invention are shown. Information handling systems, such as desktop computers, tower systems, convergence systems, servers, and the like, may be complicated to manufacture and update. To install and remove information handling system devices, such as compact disk read-only memories (CD-ROM), digital versatile disc (DVD), disk drive such as a hard disk, floppy disk, floppy/optical disk, and the like, typically required a time consuming effort to install and replace. For example, if a user wished to update a device, such as by installing a larger hard disk drive, the user had to engage in a time consuming process performed in the limited confines of an information handling system chassis. The present invention addresses these problems by proving a mounting assembly that is capable of easy operation by a user, thereby permitting faster installation and removal of information handling system devices in a more secure manner.

Figure 1:
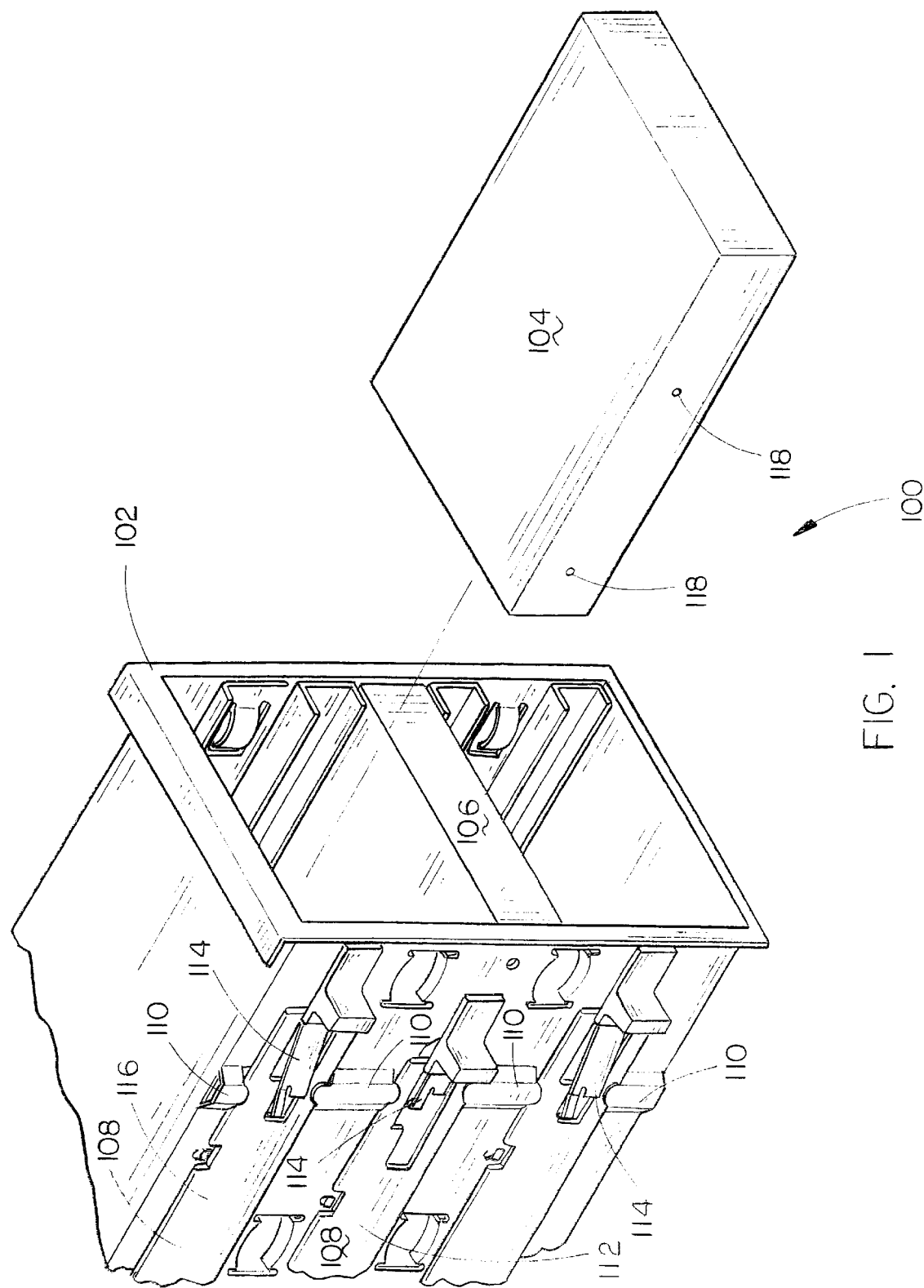
FIG. 1 is an isometric drawing of an exemplary embodiment of the present invention wherein a device retention apparatus is utilized to secure and unsecure an information handling system device.

Referring now to FIG. 1, an exemplary embodiment of the present invention is shown. A device retention assembly 100 may include a housing 102 suitable for mounting information handling system devices 104 and 106. A selection mechanism 108 is disposed on the housing 102 so as to be capable of slideable movement, which may be achieved through the use of brackets 110 which secure the selection mechanism 108 to the housing 102. The brackets 110 permit the selection mechanism 108 to slide to a first position 112 wherein the selection mechanism 108 contacts a retaining portion 114 thereby securing the device 106 to the housing 102. The brackets 110 may also permit the selection mechanism 108 to slide to a second position 116 wherein the selection mechanism 108 contacts the retaining portion 114 so as to permit removal of the device 104 from the housing 102. The retaining portion 114 may be formed so as to be suitable for engaging mounting holes 118 disposed on the device 104. Although the use of brackets for sliding the selection mechanism 108 is shown, it should be apparent that a person of ordinary skill in the art may select from a variety of methods and apparatus to permit movement of the selection mechanism without departing from the spirit and scope of the present invention.

Figure 2A:
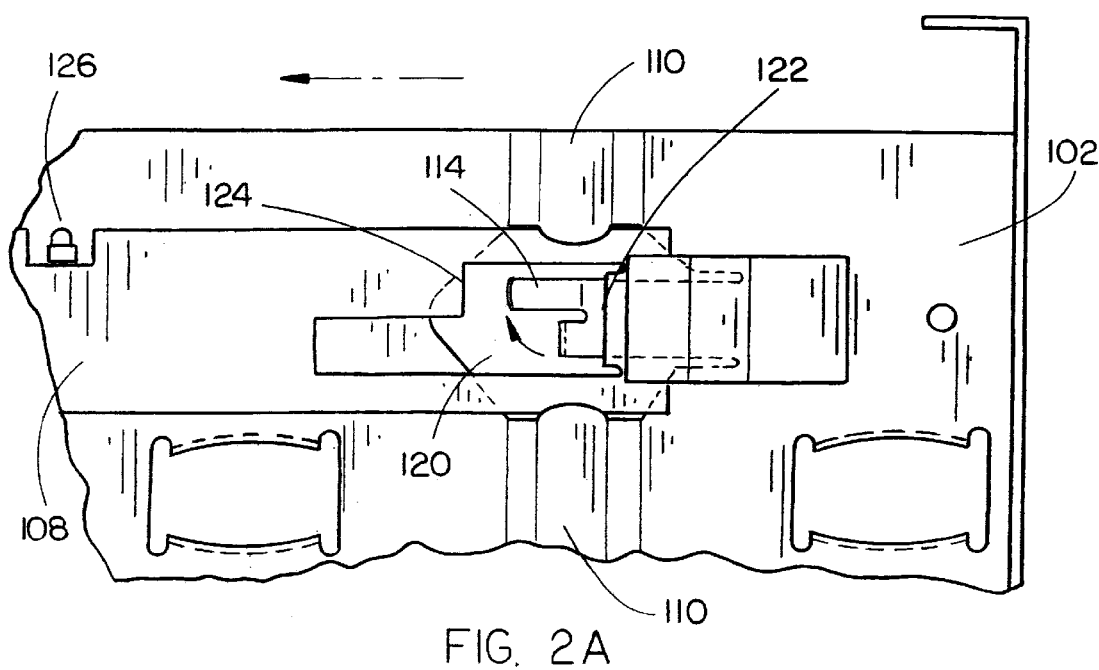
FIG. 2A depicts a side view of the exemplary embodiment depicted in FIG. 1 wherein a device retention apparatus is operated to secure a device.

Referring now to FIG. 2A, a side view of the exemplary embodiment depicted in FIG. 1 is shown wherein the device retention apparatus is operated to secure a device. A device retention apparatus may include a selection mechanism 108 disposed on a housing 102 wherein the selection mechanism 108 is capable of slideable movement along the housing 102 through the use of brackets 110. To secure a device 104 (FIG. 1) in the housing 102, the selection mechanism 108 may be moved thereby causing the selection mechanism 108 to engage a retaining portion 114, thereby forcing the retaining portion 114 toward the interior of the housing 102. In this way, the retaining portion 114 may engage a device 104 (FIG. 1) disposed in the housing 102 thus securing the device 104 (FIG. 1) to the housing 102. It may be preferable to include an aperture 120 in the selection mechanism 108 to permit the movement of the retaining portion 114 through the aperture 120, thereby increasing the range of motion of the retaining portion 114. A first edge portion 122 of the aperture 120 may then be utilized to contact the retaining portion 114 and thereby move the retaining portion 114 into a securing position.

It may also be preferable to include a viewing portion 124 as a part of the selection mechanism 108 to indicate the status of the mechanism 108. For example, when the selection mechanism 108 is in a secured state as shown in FIG. 2A, an opening 126 on the selection mechanism 108 may be used to view a securing indication disposed on the housing 102. Thus, a user may have an additional way of determining the state of the selection mechanism 108 as well as verification that the selection mechanism 108 is in a locked state.

Figure 2B:
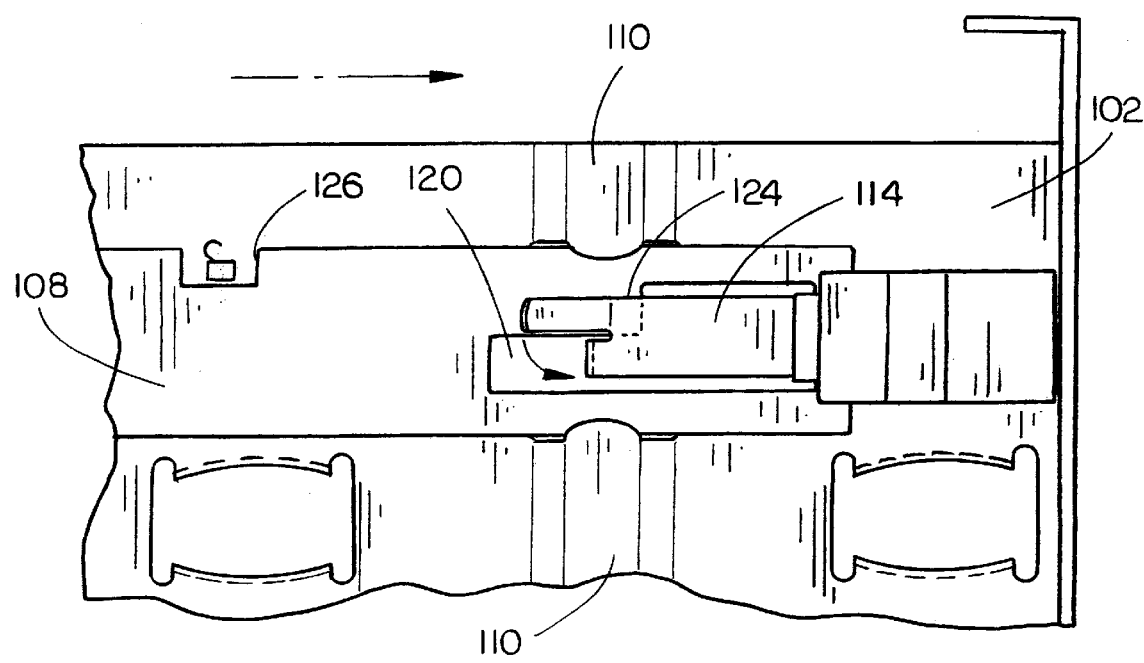
FIG. 2B illustrates a side view of the exemplary embodiment depicted in FIG. 1 wherein a device retention apparatus is operated to release a device.

Referring now to FIG. 2B, a side view of the exemplary embodiment depicted in FIG. 1 is shown wherein the device retention apparatus is operated to release a device. A device retention apparatus may include a selection mechanism 108 slideably mounted to a housing 102 with the use of brackets. To release a device 104 (FIG. 1) from the housing 102, the selection mechanism 108 may be moved to a second position so as to disengage the retaining portion 114 from the information handling system device 104 (FIG. 1) thereby permitting removal of the information handling system device from the housing 102. An aperture 120 may include a second edge portion 124 that may be utilized to contact the retaining portion 114 and thereby release the retaining portion 114. For example, the second edge portion 124 of the aperture 120 may lift the retaining portion 114 from a mounting hole 118 (FIG. 1) on a device 104 (FIG. 1) thereby permitting removal of the device 104 (FIG. 1) from the housing 102. In this way, a device may be removed from a housing in an improved manner without the necessity of tools and other labor and time intensive processes.

Figure 3B:
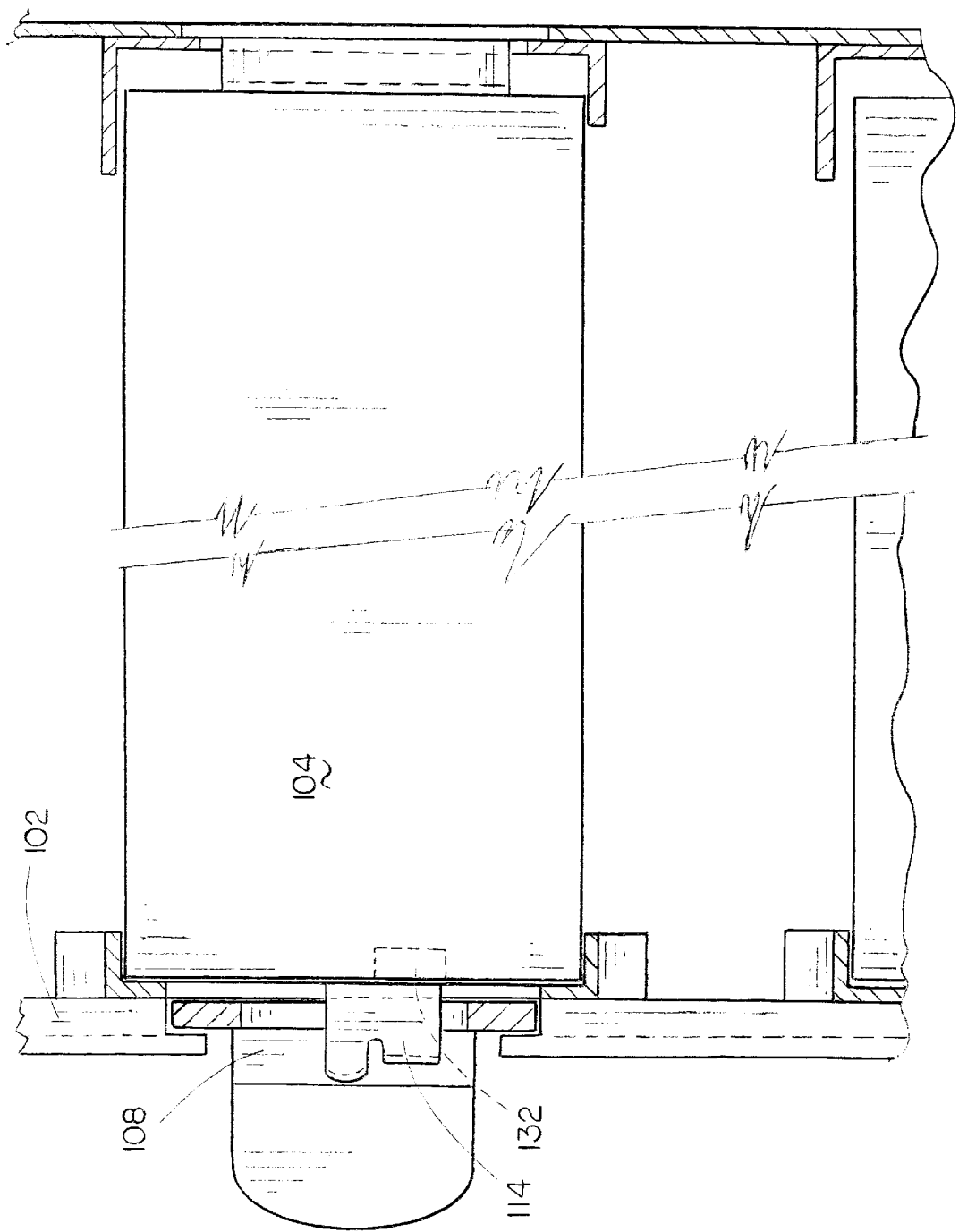
FIG. 3B is an end view of the exemplary embodiment as depicted in FIG. 3A wherein a selection mechanism is shown forcing a retaining portion into a device thereby securing the device to a housing.

Referring now to FIG. 3A, a magnified view of the exemplary embodiment illustrated in FIG. 1 is shown wherein a selection mechanism is utilized to move a retaining portion to a securing position. A housing 102 includes a retaining portion 114 formed as an integral part thereof. In this way, the retaining portion 114 and the housing 102 may be stamped from one piece of metal, thereby further saving time and expense both to manufacture and assemble. A selection mechanism 108 is disposed on the housing 102 and is capable of slideable movement as shown in FIGS. 2A and 2B. An aperture 120 disposed on the selection mechanism 108 enables the retaining portion 114 to operate through an increased range of motion. As the selection mechanism 108 is moved to a securing position, a second edge portion 124 of the aperture 120 contacts the retaining portion 114 thereby forcing the retaining portion 114 toward the interior of the housing 102, and shown in FIG. 3B. Thus, a retaining tab 132 of the retaining portion 114 may engage an information handling system device 104 to secure the device 104 to the housing 102. By utilizing the selection mechanism 108 to move and secure the retaining portion 114, the retaining portion 114 need not be made of sprung steel, thus resulting in a further cost savings as cheaper grades of material may be utilized, such as metal, plastic, composites, and the like.

Figure 3C:
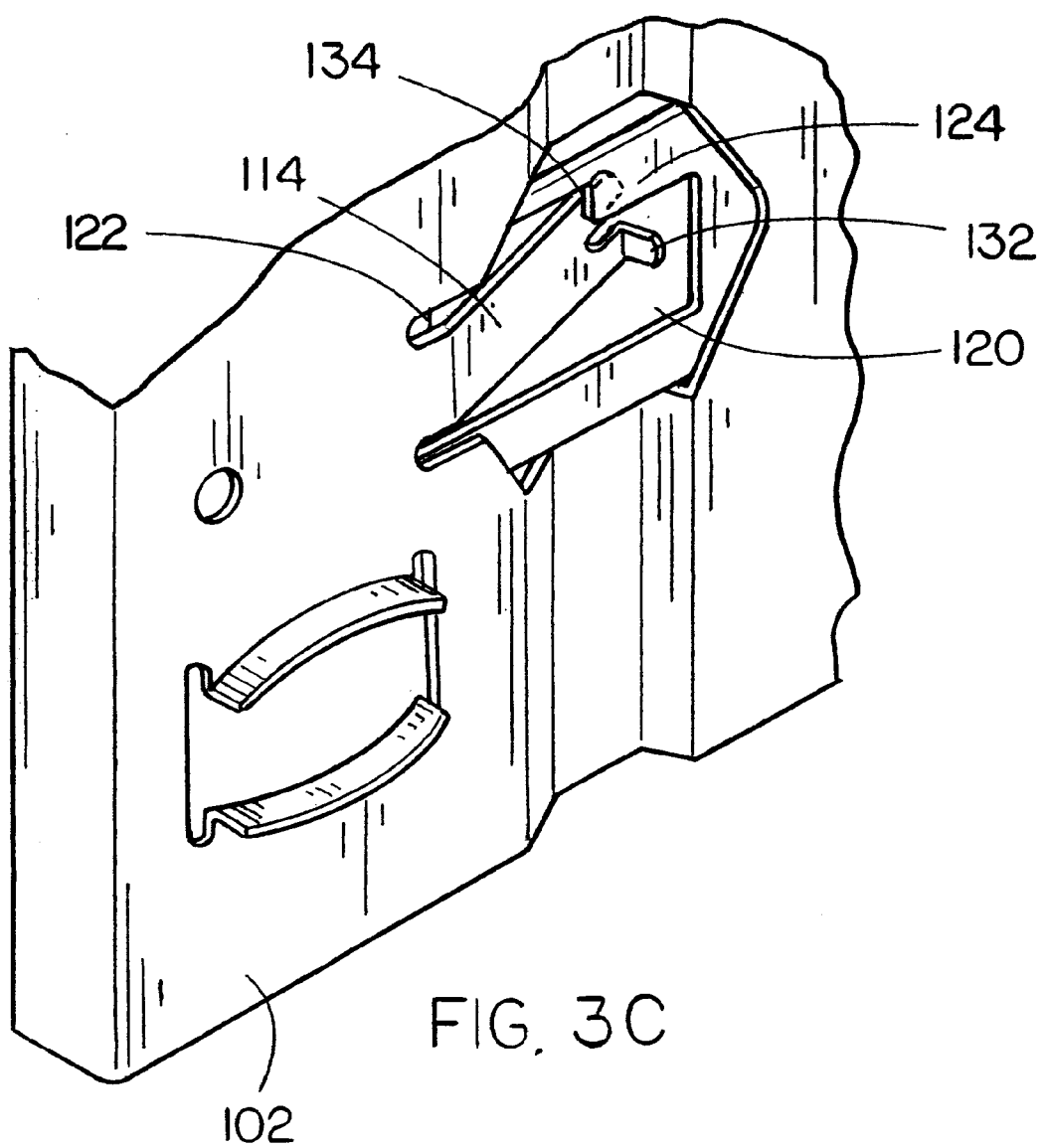
FIG. 3C is a magnified view of the exemplary embodiment as illustrated in FIG. 1 wherein a selection mechanism is utilized to move a retaining portion to release an information handling system device.

Referring now to FIG. 3C, a magnified view of the exemplary embodiment illustrated in FIG. 1 is shown wherein a selection mechanism is utilized to move a retaining portion to release an information handling system device. A housing 102 includes a retaining portion 114 formed as an integral part thereof. A selection mechanism 108 is disposed on the housing 102 and is capable of slideable movement as shown in FIGS. 2A and 2B. As the selection mechanism 108 is moved to release an information handling system device 104 (FIG. 1) from the housing 102, a first edge portion 122 of the aperture 120 contacts the retaining portion 114 thereby forcing the retaining portion 114 outward from the interior of the housing 102. The aperture 120 disposed on the selection mechanism 108 enables the retaining portion 114 to operate through an increased range of motion. Thus, a retaining tab 132 of the retaining portion 114 may be moved to a sufficient distance so as not to interfere with the insertion and removal of a device 104 (FIG. 1) from the housing 102.

It may also be preferable to include a lifting tab 134 suitable for contacting the second edge portion 124 thereby enabling increased reliability. For example, the lifting tab 134 may be formed to extend generally outward from the housing or device. Therefore, when the selection mechanism 108 is operated to release the device 104 (FIG. 1), the lifting tab 134 may aid in the removal of the retaining tab 132 from the device 104 (FIG. 1). Thus, the retaining portion 114 may be made of materials that do not have spring-like characteristics, instead the retaining portion may be operated through the movement of the selection mechanism 108.

Figure 4:
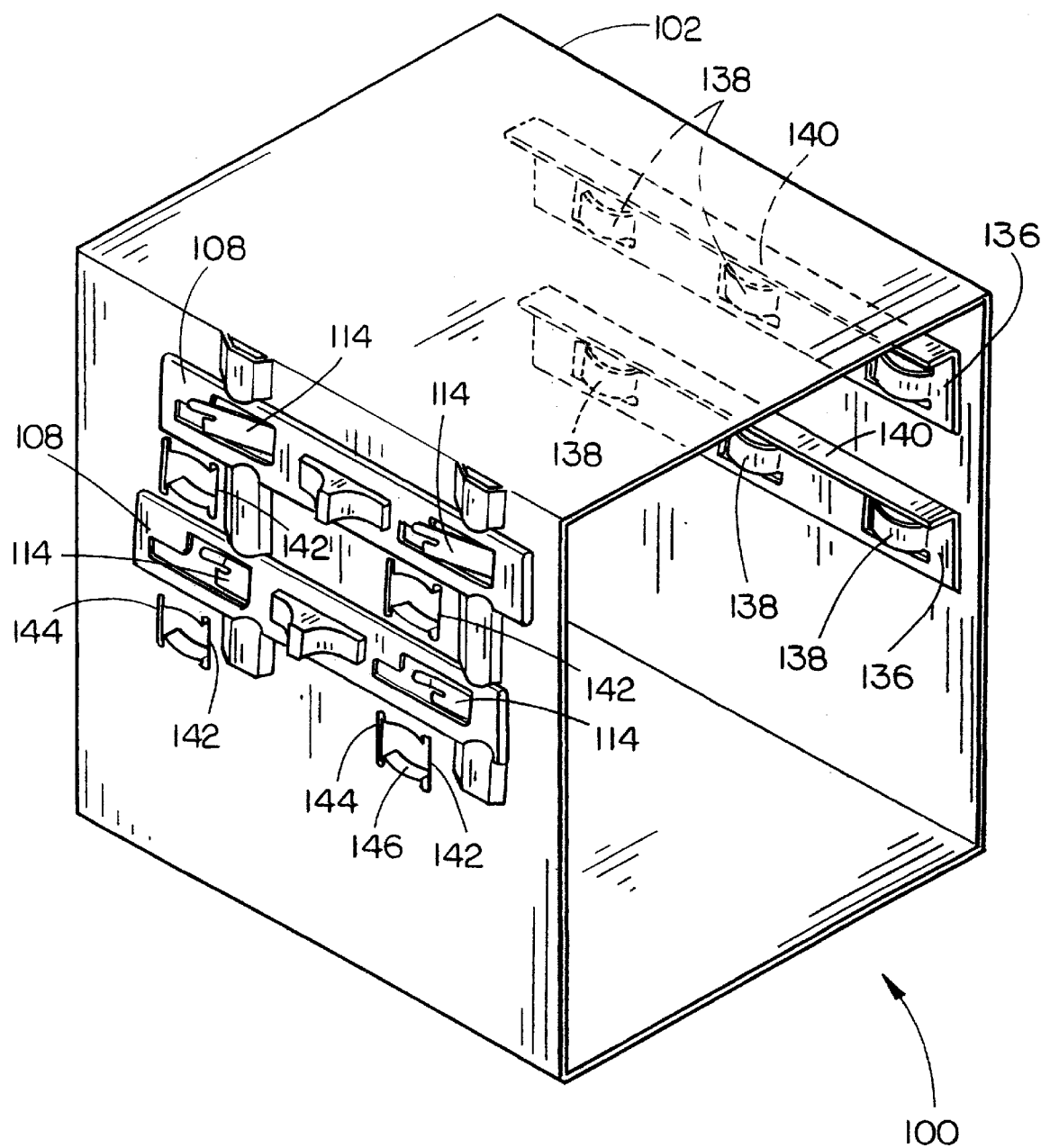
FIG. 4 depicts an exemplary embodiment wherein a device retention apparatus includes a biasing mechanism suitable for biasing a device toward a selection mechanism.

Referring now to FIG. 4, an exemplary embodiment is shown wherein a device retention apparatus includes a biasing mechanism suitable for biasing a device toward a selection mechanism. A device retention apparatus 100 may include a housing 102 suitable for mounting information handling system devices 104 and 106 (FIG. 1). Selection mechanisms 108 may be disposed on one side of the housing 102. Further, biasing mechanisms 136 may include springs 138 used to bias a device 104 (FIG. 1) inserted into the housing 102 toward the selection mechanism 108. In this way, a device may be further secured thus preventing rattling and other unwanted movement as well as encourage a more secure connection with the retaining portion 114.

Guides may also be provided to enable a device to slide along the housing in an improved manner. For example, a biasing mechanism 136 may include a rail 140 suitable for allowing a device to slide thereon. Further, guides may be formed as an integral part of the housing 102. For instance, guides 142 may be formed as a stamped portion of the housing 102 to permit a bottom of a device to slide along an upper portion 144 of the stamped guide 142. It may also be preferable to include a lower portion 146 so as to secure a top of a device to prevent unwanted movement when the device is inserted in the housing 102.

Figure 5:
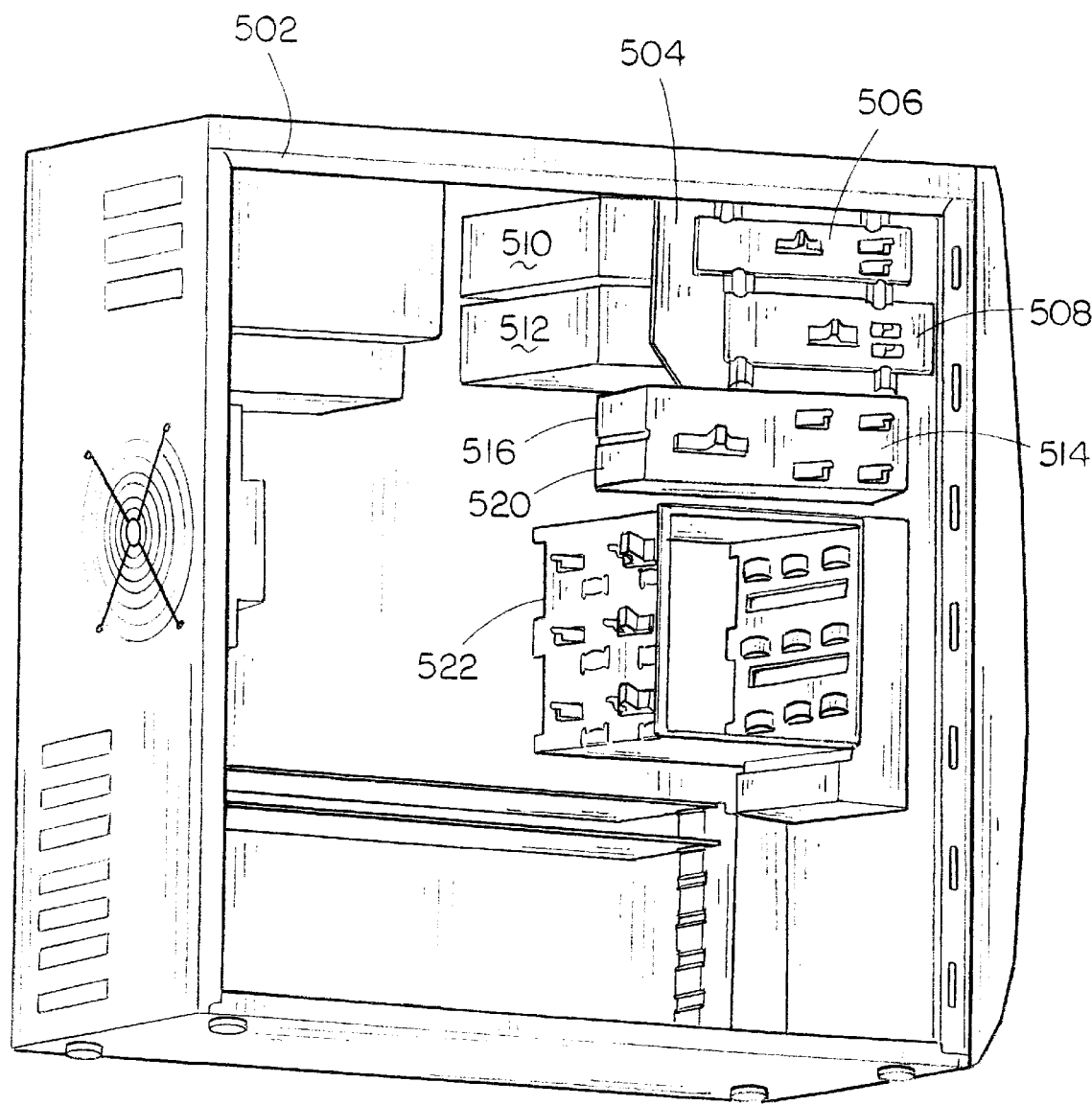
FIG. 5 illustrates an information handling system incorporating an exemplary device retention apparatus of the present invention.

A device retention apparatus may be oriented in a variety of ways and include a variety of sizes without departing from the spirit and scope of the present invention. For example, as shown in FIG. 5, an information handling system 500 formed as a tower unit is shown. The information handling system 500 includes a chassis 502 for housing various components and devices to protect the components from environmental and other potentially harmful influences. A first device retention apparatus 504 includes a first selection mechanism 506 and a second selection mechanism 508 for securing devices. The first device retention apparatus 504 is oriented in the chassis 502 so as to enable the insertion and removal of the devices 510 and 512 from the front of the chassis 502. This orientation may be preferable for removable media devices, such as compact disk read-only memories (CD-ROM), digital video disc (DVD) players, floppy drives, and the like, so as to enable a user to access the devices 510 and 512 when secured to the device retention apparatus 504. A selection mechanism 514 may also be formed to secure a plurality of devices 516 and 520 to a device retention apparatus 504.

Additionally, a device retention apparatus 522 may be oriented in a chassis 502 so as to secure traditional internal components that typically do not need to be frequently accessed by a user, such as hard drives and the like. For example, the device retention apparatus 522 may be oriented so as to secure devices in the internal portion of the chassis 502 but which may be accessed by a door disposed on the side of the chassis 502. It should be appreciated that a wide variety of sizes may be secured by the present invention and not depart from the spirit and scope thereof, such as 5¼ inch device, 3½ inch device, and the like.

Figure 6A:
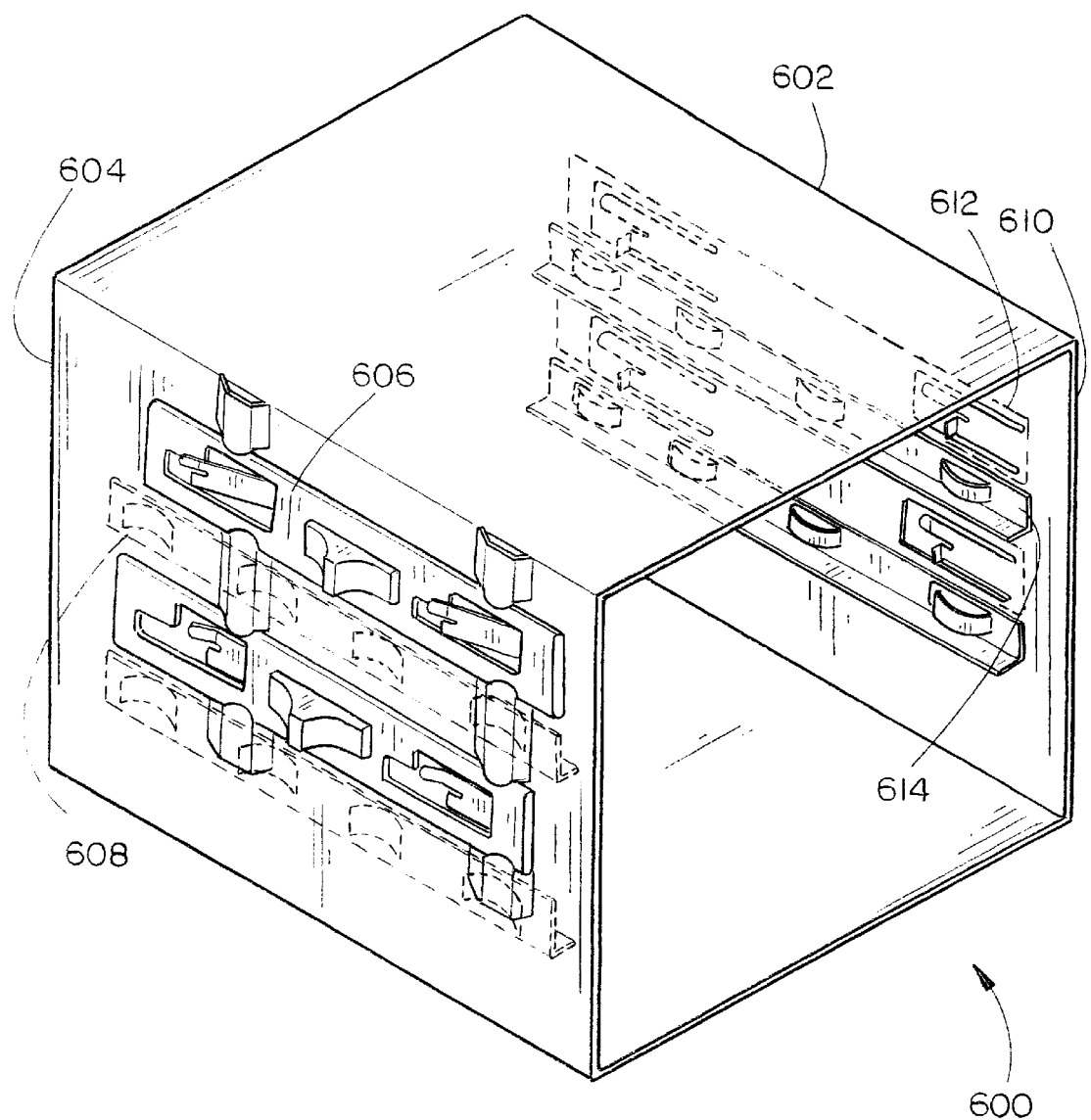
FIGS. 6A and 6B depict an additional exemplary embodiment of the present invention wherein a plurality of selection mechanisms and biasing mechanisms are shown.
Figure 6B:
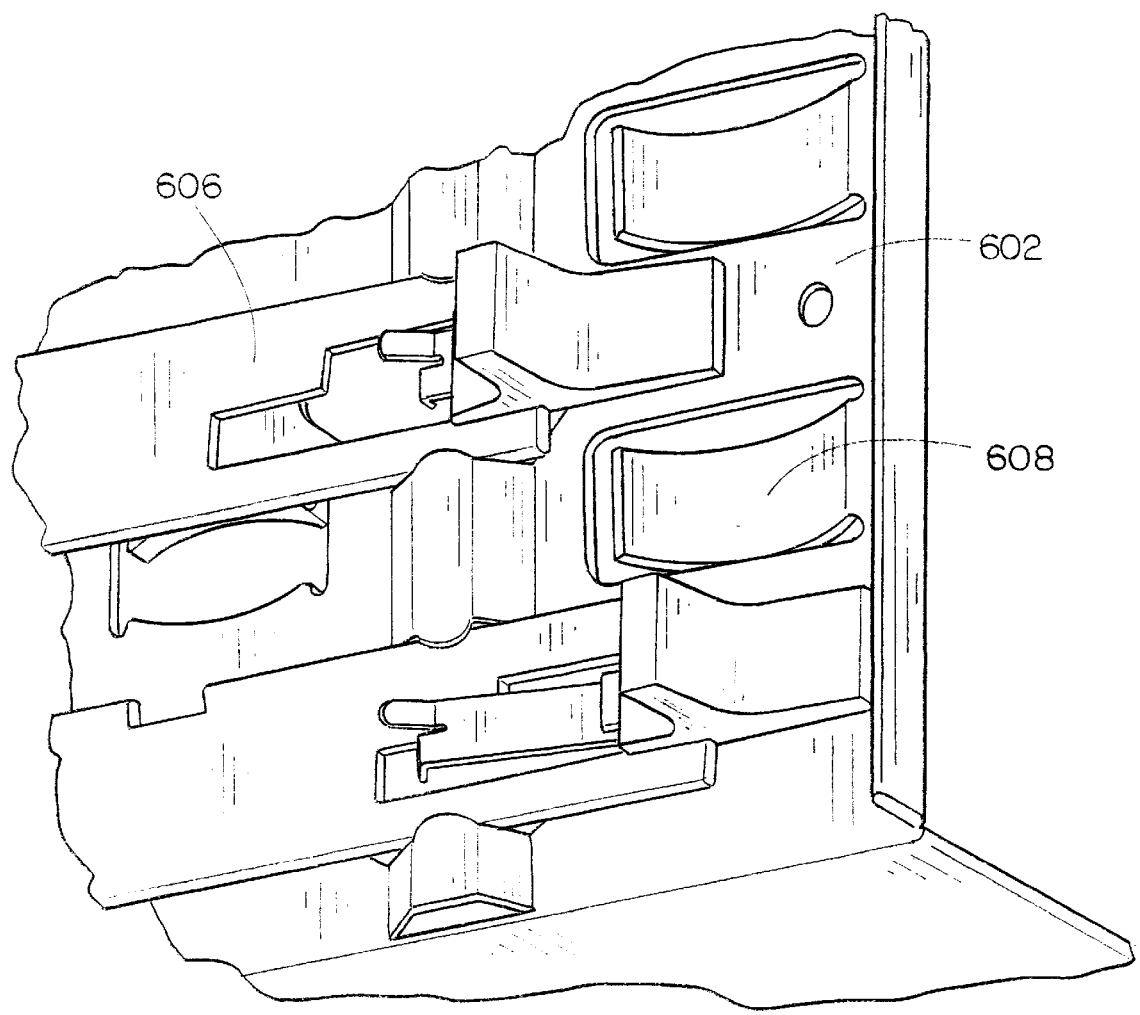

Referring now to FIGS. 6A and 6B, an additional exemplary embodiment of the present invention is shown. A device retention apparatus 600 includes a housing 602 for securing information handling system devices 104 and 106 (FIG. 1). A first side 604 of the housing 602 includes a selection mechanism 606 and a biasing mechanism 608. A second side 610 of the housing 602 also includes a selection mechanism 612 and a biasing mechanism 614. Thus, the device retention apparatus 600 is capable of securing a device on two opposing sides, thereby further securing the device. Additionally, the provision of two biasing mechanisms 608 and 614 further prevent unwanted movement of a device within the housing 602.

Figure 7:
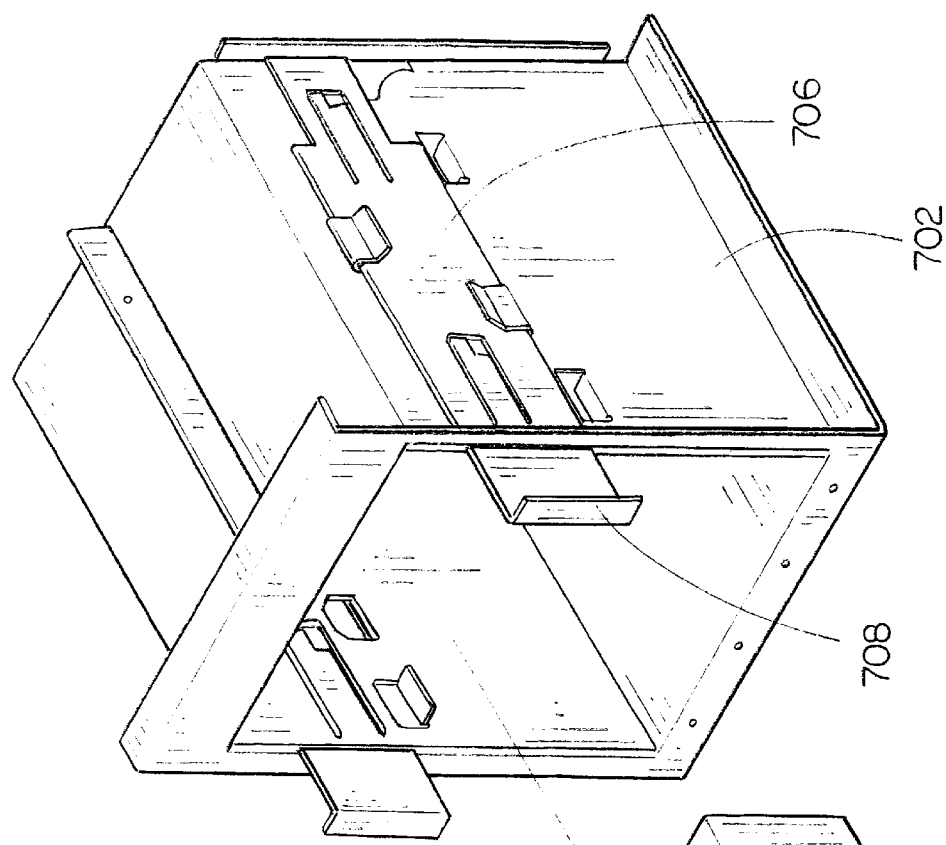
FIG. 7 illustrates an additional exemplary embodiment of the present invention wherein a device retention apparatus including a selection mechanism formed so as to extend outward from a front opening of a housing.
Figure 7:
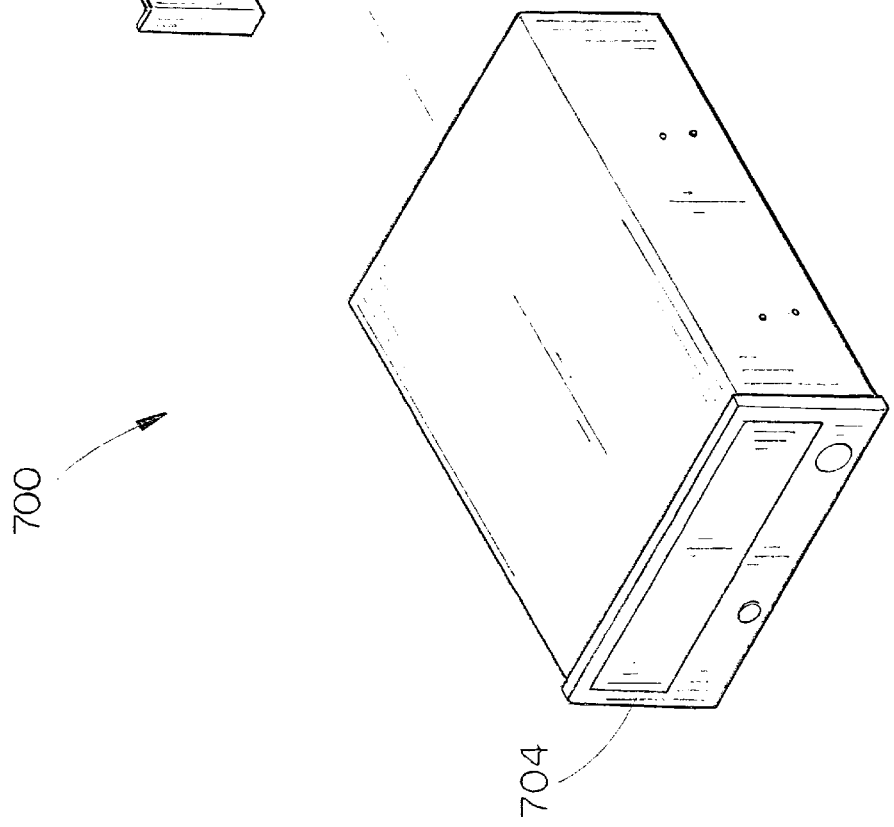

Referring now to FIG. 7, an additional exemplary embodiment of the present invention is shown. A device retention apparatus 700 includes a housing 702 for securing an information handling system device 704. The device retention apparatus 700 may also include a selection mechanism 706 disposed on the housing 702. The selection mechanism 706 may be formed so as to extend outward from the housing 702 so as to permit operation of the selection mechanism 706 from the front portion of the housing 702. For example, a handle 708 may be disposed on the front edge of the selection mechanism 706 to enable a user to grasp the handle 708 to secure and release the selection mechanism as previously described. Thus, the device retention apparatus may be operated without needing access to the devices from the side of the housing thereby permitting operation of the device retention apparatus in limited space environments.

It is believed that the device retention apparatus of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A device retention apparatus, comprising a housing suitable for mounting an information handling system device;

a retaining portion disposed on the housing, the retaining portion suitable for engaging an information handling system device when disposed in the housing; and a selection mechanism suitable for securing the information handling system device to the housing, the selection mechanism including an aperture having a first side, wherein the selection mechanism is slideably connected to the housing so as to be capable of moving between a first position and a second position so that as the selection mechanism is moved from the first position to the second position, the first side of the aperture of the selection mechanism contacts the retaining portion to force the retaining portion to engage the information handling system device, thereby securing an information handling system device to the housing.

2. The device retention apparatus as described in claim 1, wherein the retaining portion is formed as an integral part of the housing.

3. The device retention apparatus as described in claim 1, wherein the retaining portion includes a retaining tab suitable for engaging a hole disposed on the information handling system device.

4. The device retention apparatus as described in claim 1, further comprising when the selection mechanism is moved from the second position to the first position, the selection mechanism contacts the retaining portion so as to disengage the retaining portion from the information handling system device thereby permitting removal of the information handling system device from the housing.

5. The device retention apparatus as described in claim 4, wherein when the selection mechanism is placed in the second position, the retention portion is withdrawn thereby permitting at least one of insertion and removal of an information handling system device without interference from the retention portion.

6. The device retention apparatus as described in claim 1, wherein the housing includes a first side and a second side disposed on generally opposing sections of the housing, the second side including a biasing mechanism for the information handling system device against the first side of the housing, and the first side including the selection mechanism.

7. The device retention apparatus as described in claim 1, wherein the selection mechanism includes a handle so as to enable manual operation of the retention mechanism wherein the handle is capable of at least one of operation from the front of the housing and operation from the side of the housing.

8. The device retention apparatus as described in claim 1, wherein the selection mechanism includes a viewing portion so as to enable at least one of an indication of a unsecured state disposed on the housing to be viewed when the selection mechanism is in the first position and an indication of a secured state disposed on the housing to be viewed when the selection mechanism is in the second position.

9. The device retention apparatus as described in claim 1, wherein the selection mechanism is moved from a second position to the first position, a second side of the aperture of the selection mechanism contacts the retaining portion to force the retaining portion to disengage the retaining portion from the information handling system device, thereby releasing the information handling system device from the housing.

10. The device retention apparatus as described in claim 9, wherein the selection mechanism is positioned over the retaining portion so that the retaining portion is disposed through the aperture of the selection mechanism when the selection mechanism is in the first position.

11. The device retention apparatus as described in claim 1, wherein the retaining portion is positioned between the selection mechanism and the information handling system device.

12. A device retention apparatus, comprising
a housing suitable for mounting an information handling system device;
a retaining portion disposed on the housing, the retaining portion suitable for engaging an information handling system device when disposed in the housing; and
a selection mechanism suitable for securing the information handling system device to the housing, the selection mechanism including an aperture having a first side and a second side, wherein the selection mechanism is slideably connected to the housing so as to be capable of contracting the retaining portion as the selection mechanism is slid along the housing thereby causing the retaining portion to be capable of at least one of engaging an information handling system device to the housing and disengaging an information handling system device from the housing;
wherein the selection mechanism is moved from a first position to a second position, the first side of the aperture of the selection mechanism contacts the retaining portion to force the retaining portion to engage the information handling system device, thereby securing an information handling system device to the housing and wherein the selection mechanism is moved from the second position to the first position, a second side of the aperture of the selection mechanism contacts the retaining portion to force the retaining portion to disengage the retaining portion from the information handling system device, thereby releasing the information handling system device from the housing.

13. The device retention apparatus as described in claim 12, wherein the retaining portion is formed as an integral part of the housing.

14. The device retention apparatus as described in claim 12, wherein the retaining portion includes a retaining tab suitable for engaging a hole disposed on the information handling system device.

15. The device retention apparatus as described in claim 12, wherein the retention portion is withdrawn thereby permitting at least one of insertion and removal of an information handling system device without interference from the retention portion.

16. The device retention apparatus as described in claim 12, wherein the housing includes a first side and a second side disposed on generally opposing sections of the housing, the second side including a biasing mechanism for biasing the information handling system device against the first side of the housing, and the first side including the selection mechanism.

17. The device retention apparatus as described in claim 12, wherein the selection mechanism includes a handle so as to enable manual operation of the retention mechanism wherein the handle is capable of at least one of operation from the front of the housing and operation from the side of the housing.

18. The device retention apparatus as described in claim 12, wherein the selection mechanism includes a viewing portion so as to enable at least one of an indication of a unsecured state disposed on the housing to be viewed when the selection mechanism is in the first position and an indication of a secured state disposed on the housing to be viewed when the selection mechanism is in the second position.

19. The device retention apparatus as described in claim 12, wherein the selection mechanism is positioned over the retaining portion so that the retaining portion is disposed through the aperture of the selection mechanism when the selection mechanism is in the first position.

20. The device retention apparatus as described in claim 12, wherein the retaining portion is positioned between the selection mechanism and the information handling system device.

21. An information handling system chassis, comprising:

a chassis suitable for storage of information handling system devices and components;

a housing suitable for mounting an information handling system device;

a retaining portion disposed on the housing, wherein the retaining portion is formed as an integral part of the housing, the retaining portion suitable for engaging an information handling system device when disposed in the housing; and a selection mechanism suitable for securing the information handling system device to the housing, wherein the selection mechanism is slideably connected to the housing so as to be capable of moving between a first position and a second position so that as the selection mechanism is moved from the first position to the second position, the selection mechanism contacts the retaining portion thereby securing an information handling system device to the housing.

22. The information handling system chassis as described in claim 21, wherein the retaining portion includes a retaining tab suitable for engaging a hole disposed on the information handling system device.

23. The information handling system chassis as described in claim 21, further comprising when the selection mechanism is moved from the second position to the first position, the selection mechanism contacts the retaining portion so as to disengage the retaining portion from the information handling system device thereby permitting removal of the information handling system device from the housing.

24. The information handling system chassis as described in claim 23, wherein when the selection mechanism is placed in the second position, the retention portion is withdrawn thereby permitting at least one of insertion and removal of an information handling system device without interference from the retention portion.

25. The information handling system chassis as described in claim 21, wherein the housing includes a first side and a second side disposed on generally opposing sections of the housing, the second side including a biasing mechanism for biasing the information handling system device against the first side of the housing, and the first side including the selection mechanism.

26. The information handling system chassis as described in claim 21, wherein the selection mechanism includes a handle so as to enable manual operation of the retention mechanism wherein the handle is capable of operation from the front of the housing and operation from the side of the housing.

27. The information handling system chassis as described in claim 21, wherein the selection mechanism includes a viewing portion so as to enable at least one of an indication of a unsecured state disposed on the housing to be viewed when the selection mechanism is in the first position and an indication of a secured state disposed on the housing to be viewed when the selection mechanism is in the second position.

28. The information handling system chassis as described in claim 17, wherein the selection mechanism is positioned over the retaining portion so that the retaining portion is disposed through the aperture of the selection mechanism when the selection mechanism is in the first position.

29. The information handling system chassis as described in claim 21, wherein the retaining portion is positioned between the selection mechanism and the information handling system device.

* * * * *